United States Patent
Smink

(10) Patent No.: US 7,239,138 B2
(45) Date of Patent: Jul. 3, 2007

(54) MAGNETIC RESONANCE METHOD AND DEVICE

(75) Inventor: Jouke Smink, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 165 days.

(21) Appl. No.: 10/530,826

(22) PCT Filed: Sep. 12, 2003

(86) PCT No.: PCT/IB03/04024

§ 371 (c)(1),
(2), (4) Date: Apr. 8, 2005

(87) PCT Pub. No.: WO2004/034075

PCT Pub. Date: Apr. 22, 2004

(65) Prior Publication Data

US 2006/0164087 A1    Jul. 27, 2006

(30) Foreign Application Priority Data

Oct. 11, 2002    (EP)    .................................... 02079218

(51) Int. Cl.
*G01V 3/00* (2006.01)
(52) U.S. Cl. ...................................... 324/309; 324/307
(58) Field of Classification Search ................ 324/309, 324/318, 319, 307, 300; 600/410–422
See application file for complete search history.

(56) References Cited

U.S. PATENT DOCUMENTS

| | | | | |
|---|---|---|---|---|
| 5,248,942 A | * | 9/1993 | Ratzel et al. ................ | 324/309 |
| 5,298,862 A | * | 3/1994 | Hennig ........................ | 324/309 |
| 5,347,216 A | * | 9/1994 | Foo ............................. | 324/309 |
| 5,349,295 A | * | 9/1994 | Tokunaga .................... | 324/309 |
| 6,230,039 B1 | * | 5/2001 | Stuber et al. ............... | 600/410 |
| 6,662,038 B2 | * | 12/2003 | Prince ........................ | 600/420 |
| 6,681,132 B1 | * | 1/2004 | Katz et al. .................. | 600/410 |
| 6,804,384 B2 | * | 10/2004 | Lowen ....................... | 382/128 |
| 2004/0051527 A1 | * | 3/2004 | Mugler, III et al. ........ | 324/309 |
| 2005/0065430 A1 | * | 3/2005 | Wiethoff et al. ............ | 600/413 |

FOREIGN PATENT DOCUMENTS

| | | | |
|---|---|---|---|
| EP | O 909 958 A@ | * | 9/1998 |
| EP | 0 909 958 A2 | | 4/1999 |
| WO | WO 00/31559 A1 | | 6/2000 |

OTHER PUBLICATIONS

Stuber et al : Radiology vol. 212; 579-587 (1999).*
Botnar, R.M., et al.; 3D Coronary Vessel Wall Imaging Utilizing a Local Inversion Technique with Spiral Image Acquisition; MRM; 2001; 46:848-854.

(Continued)

*Primary Examiner*—Brij B. Shrivastav

(57) ABSTRACT

A portion of an object is subjected to a T2-preparation sequence. The portion of the object is subjected to a 2D navigator restore sequence. Subsequent to subjecting the portion of the object to the 2D navigator restore sequence and T2-preparation sequence, the portion of the object is subjected to a 2D navigator sequence. A MR navigator signal is measured. A series of MR imaging signals is generated by subjecting the portion of the object to an imaging sequence. The MR imaging signals are measured for reconstructing an MR image.

15 Claims, 2 Drawing Sheets

OTHER PUBLICATIONS

Botnar, R.M., et al.; A Fast 3D Approach for Coronary MRA; J. Mag. Res. Imaging; 1999; 10:821-825.

Spuentrup, E., et al.; Navigator-gated and real-time motion corrected free-breathing MR Imaging; Fortschr Rontgenstr; 2002; 174:562-567.

Spuentrup, E., et al.; The Impact of Navigator Timing Parameters and Navigator Spatial Resolution on 3D Coronary MRA; J. MRI; 2001; 14:311-318.

Stuber, M., et al.; Three-Dimensional High-Resolution Fast Spin-Echo Coronary MRA; MRM; 2001; 45:206-211.

Stuber, M., et al.; Submillimeter Three-dimensional Coronary MR Angiography; Radiology; 1999; 212:579-587.

* cited by examiner

MAGNETIC RESONANCE METHOD AND DEVICE

The application relates to a method for magnetic resonance imaging of at least a portion of a body placed in a stationary and substantially homogeneous main magnetic field, the method comprising the following steps:

a) subjecting said portion to a $T_2$-preparation sequence;
b) further subjecting said portion to a 2D navigator sequence;
c) measuring a MR navigator signal;
d) generating a series of MR imaging signals by subjecting said portion to an imaging sequence;
e) measuring said MR imaging signals for reconstructing an MR image from said signals.

Furthermore, the application relates to a device for magnetic resonance imaging for carrying out this method.

In magnetic resonance imaging (MRI), pulse sequences consisting of RF and magnetic field gradient pulses are applied to an object (a patient) to generate magnetic resonance signals, which are scanned in order to obtain information therefrom and to reconstruct images of the object. Since its initial development, the number of clinical relevant fields of application of MRI has grown enormously. MRI can be applied to almost every part of the body, and it can be used to obtain information about a number of important functions of the human body. The pulse sequence which is applied during a MRI scan determines completely the characteristics of the reconstructed images, such as location and orientation in the object, dimensions, resolution, signal-to-noise ratio, contrast, sensitivity for movements, etcetera. An operator of a MRI device has to choose the appropriate sequence and has to adjust and optimize its parameters for the respective application.

Known methods of the type specified above can be employed for magnetic resonance angiography (MRA), particularly for coronary MRA.

$T_2$-weighted imaging sequences are used in general clinical application because they provide exquisite soft tissue contrast. Known imaging methods consist of an initial contrast preparation period, during which the longitudinal magnetization is prepared according to the desired contrast. Such a $T_2$-preparation sequence enables the production of $T_2$-weighted images. This is particularly useful in coronary MRA, because an enhanced contrast between the blood in the coronary arteries and the myocardium is obtained (so called bright-blood methods).

Because respiratory motion of the heart can severely deteriorate the image quality of cardiac MR imaging, gating and image correction based on MR navigator signals was introduced to reduce these artifacts. By means of such MR navigator signals, the position of the diaphragm can be monitored and used as an input for an appropriate gating algorithm. Furthermore, the information of the navigator signal may be used to perform motion correction to improve image quality.

For registering the MR navigator signals, so-called 2D RF pulses may be used. These excite a spatially restricted volume, for example of pencil beam shape, which is read out using a gradient echo. This allows to monitor motions of the examined portion of the body along one direction. In coronary MRA, the navigator volume is usually localized at the dome of the right hemidiaphragm such that the motion of the diaphragm can be observed by the image contrast between the liver and the lung.

The above-mentioned 2D RF pulses include shaped RF pulses which are irradiated in combination with fast magnetic field gradient switching. It has been shown, that this technique facilitates the excitation of arbitrarily shaped profiles in two dimensions.

Subsequent to the $T_2$-preparation and the measurement of the MR navigator signals, usually a series of phase-encoded spin echoes is generated by an appropriate imaging sequence of RF pulses and magnetic field gradient pulses. These spin echoes are measured as MR imaging signals for reconstructing an MR image therefrom, for example by 2D Fourier transformation.

A $T_2$-contrast enhanced MRA procedure of the type specified above is for example described in a publication by Botnar (R. M. Botnar et al., "A Fast 3D Approach for Coronary MRA", Journal of Magnetic Resonance Imaging, volume 10, pages 821–825, 1999). According to this known method, at first a $T_2$-preparation sequence is applied in order to obtain the desired contrast between blood and muscle. Thereafter, the patient is subjected to a so-called regional saturation pulse for suppression of signal contributions from the chest wall. The next step is the application of the 2D navigator sequence and the measurement of the MR navigator signal. According to the above article, then a spectral saturation inversion recovery sequence in employed for fat suppression prior to the actual imaging sequence, which is a so-called 3D TFE-EPI sequence.

With this known method, it is advantageous that the navigator signal comes immediately before the imaging sequence. It has been shown by Spuentrup (Spuentrup et al., "The Impact of Navigator Timing Parameters and Navigator Spatial Resolution on 3D Coronary Magnetic Resonance Angiography", Journal of Magnetic Resonance Imaging, volume 14, pages 311–318, 2001) that it is crucial to minimize the delay between the navigator and the imaging sequence. But one of the main drawbacks of the known method is that the initial $T_2$-preparation disturbs the generation and registration of the MR navigator signal. This is because the longitudinal magnetization of the lung-liver interface, which is used to monitor the position of the diaphragm during the respiratory motion of the patient, is substantially reduced due to the preceding $T_2$-preparation sequence. As a result, the navigator may fail to detect the diaphragmatic position such that a diagnostic image of sufficient quality can not be generated. This is particularly valid if, depending on the position of the navigator, structures within the liver such as the gall bladder, which has a long $T_2$, produce bright navigator signals. These signals might easily be misinterpreted by the involved algorithms.

Therefore, it is readily appreciated that there is a need for an MRI method which enables T2-contrast enhanced imaging without limiting the quality of the MR navigator signal.

In accordance with one aspect, a method for magnetic resonance imaging of the type specified above is disclosed, wherein the aforementioned object is achieved by subjecting the portion of the body to a 2D navigator restore sequence prior to subjecting the portion to the 2D navigator sequence.

The present application enables to perform fast tomographic scanning with enhanced T2 contrast. While the method is valuable for MRA, it can also be applied to any navigator based imaging technique. The structure of the imaging procedure is similar to the above-described method. But the essential difference is the application of the 2D navigator restore sequence, which is generated prior to the actual 2D navigator sequence. The 2D navigator restore sequence comprises RF pulses and magnetic field gradient pulses, which are selected such that the effect the $T_2$-preparation sequence has on the MR navigator signal is largely compensated for. This compensation can effectively be performed, because with the 2D navigator restore sequence it is possible to selectively manipulate nuclear magnetization in the particular restricted volume, which is subsequently sampled by the 2D navigator sequence.

The application of a 2D navigator restore sequence is known in a different context from a publication by Stuber (M. Stuber et al., "Three-Dimensional High-Resolution Fast Spin-Echo Coronary Magnetic Resonance Angiography", Magnetic Resonance in Medicine, volume 45, pages 206–211, 2001). But in contrast to the present application, this known publication is dealing with the so-called black blood technique, in which an initial RF pulse for non-selective inversion of the nuclear magnetization is followed by a selective inversion pulse for re-inversion of the magnetization. After the initial pulse, there is an inversion delay to facilitate signal-pulling of the in-flowing blood at the region of interest. According to the above publication, a 2D navigator restore sequence is implemented, which locally reinverts (i.e. restores) the longitudinal magnetization at the position of the navigator. This method does obviously not enable $T_2$-weighted imaging with a high $T_2$ contrast and with a well-functioning navigator.

In one embodiment, the $T_2$-preparation sequence comprises at least two RF pulses, which are separated by a relaxation period, for enhancing the contrast between tissues with different transverse relaxation times. With the initial RF- pulse, which is, for example, a 90° pulse, the equilibrium magnetization is transformed into transverse magnetization. Only magnetization of tissue with a long $T_2$ will survive the subsequent relaxation period. After the relaxation period, the remaining transverse magnetization is transformed back into longitudinal magnetization by the so-called "tip-up" RF pulse of the $T_2$-preparation sequence, which for example has a flip angle of 90°. It is also possible that the $T_2$-preparation sequence further comprises an even number of substantially 180° RF pulses, thereby avoiding preliminary loss of transverse magnetization because of local inhomogeneities of the main magnetic field.

A 2D navigator sequence, which comprises at least two shaped RF pulses and at least one gradient pulse being switched during irradiation of said shaped RF pulse, to enable the excitation of nuclear magnetization within a spatially restricted navigator volume. In this way, the 2D navigator restore sequence can be applied during the relaxation period of the $T_2$-preparation sequence for selectively transforming transverse magnetization within the navigator volume into longitudinal magnetization. This procedure enables the simultaneous application of the $T_2$- preparation sequence and the 2D navigator sequence, which is particularly advantageous regarding the speed of the imaging procedure. No additional time is needed for the 2D navigator restore sequence by integrating it into the $T_2$-preparation sequence. In practice, the transverse magnetization, which is generated by the initial RF pulse of the $T_2$-preparation sequence, is immediately transformed back into longitudinal magnetization by the 2D navigator restore sequence. At the end of the relaxation period, this longitudinal magnetization is again transformed into transverse magnetization such that it can be restored into longitudinal magnetization by the non-selective tip-up pulse of the $T_2$-preparation sequence.

In one embodiment, the MR navigator signal can advantageously be employed for gating of the imaging sequence and/or for adjusting the parameters of said imaging sequence and/or for correction of said MR image. Regarding the image quality, good results are obtained if both gating and adaptive motion correction of the imaged volume (so-called slice-tracking) are performed.

In one embodiment, the imaging sequence is a turbo field echo (TEE) sequence, for example, a 3D TFE-EPI sequence with partial k-space acquisition.

It is easily possible to incorporate the method of the present application in a dedicated device for magnetic resonance imaging of a body placed in a stationary and substantially homogeneous main magnetic field. Such a MRI scanner comprises means for establishing the main magnetic field, means for generating gradient magnetic fields superimposed upon the main magnetic field, means for radiating RF pulses towards the body, control means for controlling the generation of the gradient magnetic fields and the RF pulses, means for receiving and sampling magnetic resonance signals generated by sequences of RF pulses and switched gradient magnetic fields, and reconstruction means for forming an image from said signal samples. In accordance with one aspect, the control means, which is for example, a microcomputer with a memory and a program control, comprises a programming with a description of an imaging procedure according to the above-described method. For ECG-gating of the imaging procedure, ECG-means may be provided for registering ECG-data from the body of the patient. These ECG-data may be processed by the control means of the MRI scanner.

The application further relates to a computer program which when loaded in the computer, enables the MR-system to perform the described method. The computer program according to the application enables the magnetic resonance imaging system to achieve the technical effects involved in performing the magnetic resonance imaging method of the application. The computer program is loaded in the computer of micro-processor of the magnetic resonance imaging system. The computer program of the application may be provided on a data carrier such as a CD-ROM or may be made available via a data network, such as the world-wide web.

The following drawings disclose preferred embodiments of the present invention. It should he understood, however, that the drawings are designed for the purpose of illustration only and not as a definition of the limits of the invention.

Figure 1:
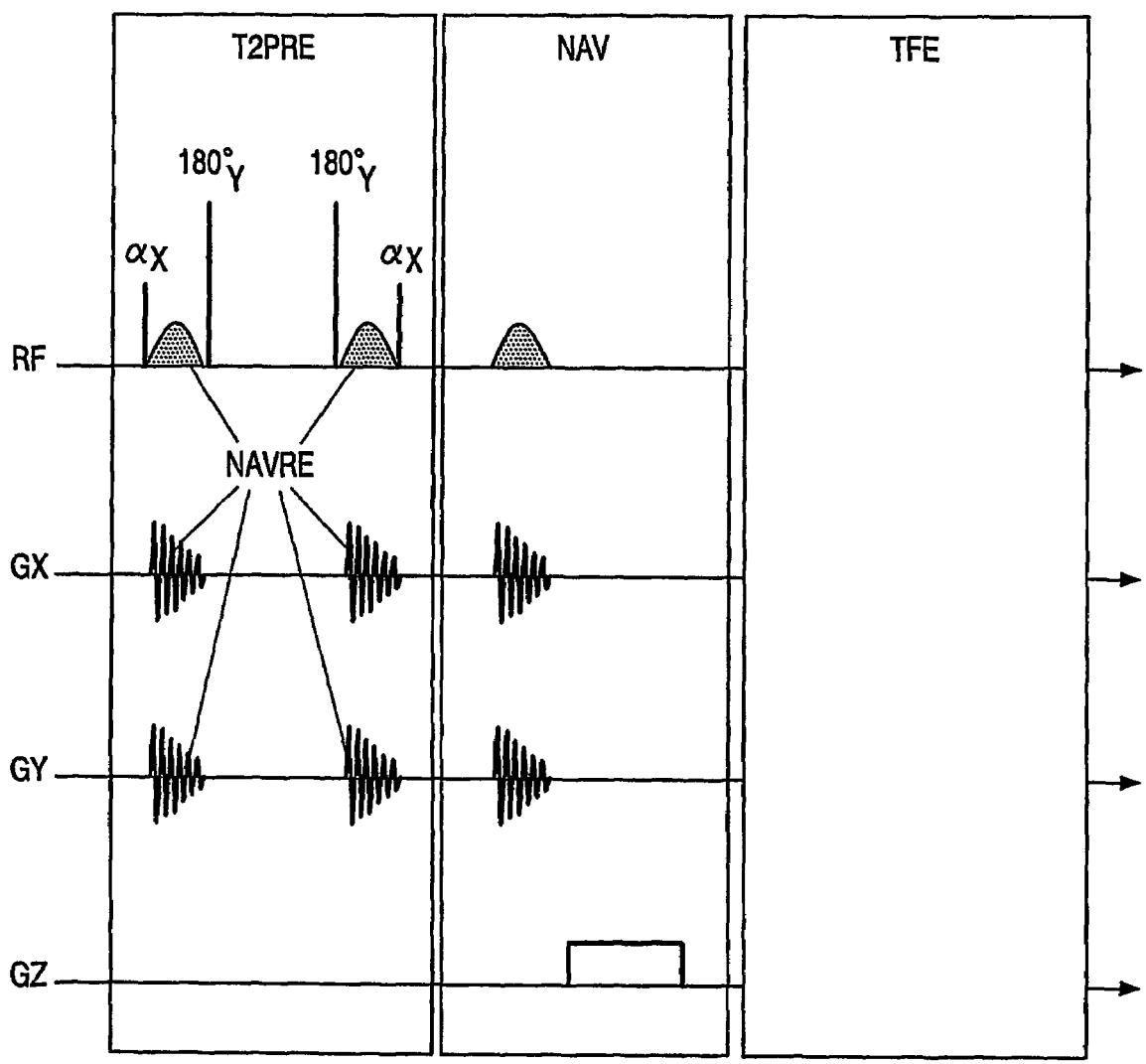
FIG. 1 shows a diagram of a pulse sequence.

A sequence design in accordance with the method of the present application is depicted in FIG. 1. The diagram shows the temporal succession of radio frequency pulses RF and of magnetic field gradient pulses GX, GY, GZ in three orthogonal directions. A patient placed in a stationary and substantially homogeneous main magnetic field is subjected to these pulses during the MRI procedure.

The sequence begins with a $T_2$-preparation sequence T2PRE comprising two non-selective RF pulses $\alpha_X$, which are separated by a relaxation period. Only nuclear magnetization of tissue with a long $T_2$ will survive the relaxation period of the sequence T2PRE. This magnetization is transformed into longitudinal magnetization with the second $\alpha_X$ pulse. The $T_2$-preparation sequence T2PRE further comprises two 180° $_Y$ RF pulses in order to avoid preliminary loss of transverse magnetization because of local inhomogeneities of the main magnetic field.

As further shown in FIG. 1, a 2D navigator sequence NAV is applied after the sequence T2PRE. The sequence NAV comprises a 2D pulse including a shaped RF pulse, during which gradients GX and GY are switched rapidly. A restricted two-dimensional spatial profile, as for example a pencil beam shaped navigator volume at the dome of the right diaphragm of the patient, is excited by these pulses. At the end of the 2D navigator sequence NAV a MR navigator signal is measured in the presence of a gradient GZ, thereby enabling the reconstruction of a one-dimensional image of the navigator volume. This image can be used to monitor the position of the patient's diaphragm during respiration.

A series of MR imaging signals is generated by subjecting the patient to a turbo field echo sequence TFE. These signals are measured and used for reconstruction of an diagnostic MR image, for example of the coronary arteries of the patient. The navigator signals, which had been measured during the sequence NAV, are used for gating of the imaging sequence TFE and for correction of the reconstructed MR image.

In one embodiment, a 2D navigator restore sequence NAVRE is applied prior to the 2D navigator sequence NAV. In FIG. 1, the sequence NAVRE is incorporated into the sequence T2PRE in order not to loose any time with the application of additional pulses. The 2D navigator restore sequence NAVRE comprises a first 2D pulse, which is irradiated immediately after the first $\alpha_x$ pulse, thereby selectively transforming the transverse magnetization of the navigator volume, which was generated by the initial RF pulse $\alpha_x$, back into longitudinal magnetization. This longitudinal magnetization is not affected by transverse relaxation during the relaxation period. A second 2D pulse of the sequence NAVRE is applied just before the second pulse. The longitudinal magnetization of the navigator volume is again transformed into transverse magnetization such that it is restored into longitudinal magnetization by the second "tip-up" $\alpha_x$ pulse of the $T_2$-preparation sequence T2PRE. As a result, the nuclear magnetization of the navigator volume is virtually not disturbed by the $T_2$-contrast enhancing sequence T2PRE.

Figure 2:
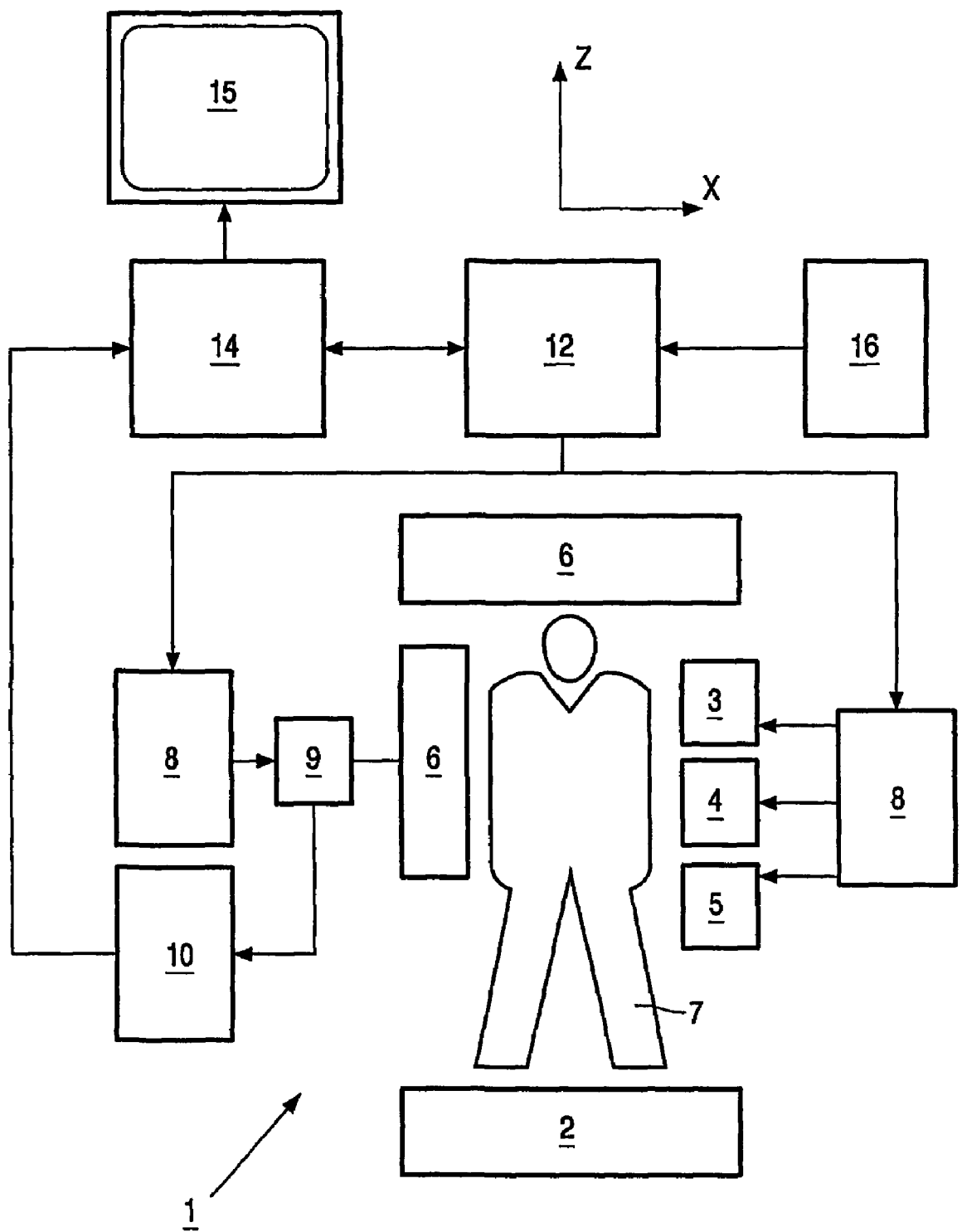
FIG. 2 shows an embodiment of a MRI scanner.

In FIG. 2 a magnetic resonance imaging device 1 is diagrammatically shown. The apparatus 1 comprises a set of main magnetic coils 2 for generating a stationary and homogeneous main magnetic field and three sets of gradient coils 3, 4 and 5 for superimposing additional magnetic fields with controllable strength and having a gradient in a selected direction. Conventionally, the direction of the main magnetic field is labeled the z-direction, the two directions perpendicular thereto the x-and y-directions. The gradient coils are energized via a power supply 11. The apparatus 1 further comprises a radiation emitter 6, an antenna or coil, for emitting radio frequency (RF) pulses to a body 7, the radiation emitter 6 being coupled to a modulator 8 for generating and modulating the RF pulses. Also provided is a receiver for receiving the MR-signals, the receiver can be identical to the emitter 6 or be separate. If the emitter and receiver are physically the same antenna or coil as 30 shown in FIG. 2, a send-receive switch 9 is arranged to separate the received signals from the pulses to be emitted. The received MR-signals are input to a demodulator 10. The modulator 8, the emitter 6 and the power supply 11 for the gradient coils 3,4 and 5 are controlled by a control system 12 to generate the above-described sequence of RF pulses and a corresponding sequence of magnetic field gradient pulses. The control system can be a microcomputer with a memory and a program control. For example it comprises a programming with a description of an imaging procedure according to the above-described method. The demodulator 10 is coupled to a data processing unit 14, for example a computer, for transformation of the received echo signals into an image that can be made visible, for example on a visual display unit 15. There is an input means 16, e.g. an appropriate keyboard, connected to the control system 12, which enables an operator of the device to interactively adjust the parameters of the imaging procedure.

The invention claimed is:

1. Method for magnetic resonance imaging of at least a portion of a body placed in a stationary and substantially homogeneous main magnetic field, the method comprising:
   subjecting said portion to a T2-preparation sequence which enhances contrast between tissues with different transverse relaxation times;
   subjecting said portion to a 2D navigator restore sequence which selectively transforms transverse magnetization into longitudinal magnetization within an imaging volume and compensates for magnetic signals generated by the T2-preparation sequence;
   subsequent to subjecting said portion to the 2D navigator restore sequence and T2-preparation sequence, subjecting said portion to a 2D navigator sequence;
   measuring a MR navigator signal;
   generating a series of MR imaging signals by subjecting said portion to an imaging sequence; and
   measuring said MR imaging signals for reconstructing an MR image of said portion from said signals.

2. Method of claim 1, wherein said T2-preparation sequence comprises at least first and second RF pulses ($\alpha X$), which are separated by a relaxation period, for enhancing the contrast between tissues with different transverse relaxation times.

3. Method of claim 2, wherein said 2D navigator sequence comprises at least one shaped RF pulse and at Least one gradient pulse being switched during irradiation of said shaped RF pulse in order to excite nuclear magnetization within a spatially restricted navigator volume.

4. Method according to claim 3, wherein said 2D navigator restore sequence includes at least first and second RF restore pulses and further including:
   applying in the first navigator RF restore pulse immediately subsequent to applying the first T2 pulse;
   applying the second navigator RF restore pulse immediately preceding to applying the second T2 pulse; and
   selectively transforming transverse magnetization within said navigator volume into longitudinal magnetization during the T2-preparation sequence relaxation period.

5. Method of claim 2, wherein said T2-preparation sequence further comprises an even number of substantially 180° RF pulses.

6. Method of claim 1, wherein said MR navigator signal is employed for gating of said imaging sequence and/or for adjusting the parameters of said imaging sequence and/or for correction of said MR image.

7. Method of claim 1, wherein said imaging sequence is a turbo field echo sequence.

8. Device for magnetic resonance imaging of a body placed in a stationary and substantially homogeneous main magnetic field, the device comprising means for establishing said main magnetic field, means for generating magnetic field gradients superimposed upon said main magnetic field, means for radiating RF pulses towards said body, control means for controlling the generation of said magnetic field gradients and said RF pulses, means for receiving and sampling magnetic resonance signals generated by sequences of RF pulses and switched magnetic field gradients, and reconstruction means for forming an image from said signal samples, wherein said control means comprises a programming with a description of an imaging procedure according to the method of claim 1.

9. Device of claim 8, further including:
   ECG-means for registering ECG-data from said body, said ECG-data being processed by said control means for gating said imaging procedure.

10. A computer readable medium including instructions for controlling a computer system to:
subject a portion of an object to be examined to a T2-preparation sequence which enhances contrast between tissues with different transverse relaxation times;
simultaneously with subjecting said portion of the object to the T2-preparation sequence, interleavingly subject said portion of the object to a 2D navigator restore sequence which selectively transforms transverse magnetization into longitudinal magnetization within an imaging volume and compensates for magnetic signals generated by the T2-preparation sequence
subsequently to subjecting said portion of the object to the T2-preparation sequence and 2D navigator restore sequence, subject said portion to a 2D navigator sequence;
measure a MR navigator signal;
generate a series of MR imaging signals by subjecting said portion to an imaging sequence;
measure said MR imaging signals for reconstructing an MR image of said portion from said signals.

11. A method comprising:
applying at least first and second T2 weighted sequence RF pulses which first and second T2 pulses are separated by a relaxation period;
immediately after application of the first T2 pulse, applying a first 2D navigator restore sequence RF pulse;
selectively transforming transverse magnetization generated by the T2 sequence within a navigator volume into longitudinal magnetization with the first 2D navigator restore sequence RF pulse;
applying a second 2D navigator restore pulse immediately preceding to applying the second T2 pulse; and
transforming the longitudinal magnetization into transverse magnetization with the second 2D navigator restore pulse.

12. The method of claim 11, further including:
applying a 2D navigator sequence;
measuring a MR navigator signal;
generating a series of MR imaging signals; and
reconstructing an MR image of the navigator volume from the MR signals.

13. The method of claim 12, wherein the navigator volume is pencil shaped.

14. The method of claim 13, wherein the navigator image is a one dimensional image.

15. The method of claim 14, wherein the navigator image is used to gate diagnostic imaging of a volume different from the navigator volume.

* * * * *